United States Patent
Zhao et al.

(10) Patent No.: US 9,620,220 B2
(45) Date of Patent: Apr. 11, 2017

(54) DATA RETENTION FLAGS IN SOLID-STATE DRIVES

(71) Applicant: Western Digital Technologies, Inc., Irvine, CA (US)

(72) Inventors: Dengtao Zhao, Santa Clara, CA (US); Yongke Sun, Pleasanton, CA (US); Haibo Li, Sunnyvale, CA (US); Jui-Yao Yang, San Jose, CA (US); Kroum Stoev, Pleasanton, CA (US)

(73) Assignee: Western Digital Technologies, Inc., Irvine, CA (US)

(*) Notice: Subject to any disclaimer, the term of this patent is extended or adjusted under 35 U.S.C. 154(b) by 0 days.

(21) Appl. No.: 15/043,443

(22) Filed: Feb. 12, 2016

(65) Prior Publication Data

US 2016/0163392 A1 Jun. 9, 2016

Related U.S. Application Data

(63) Continuation of application No. 14/090,426, filed on Nov. 26, 2013, now Pat. No. 9,263,136.

(Continued)

(51) Int. Cl.

| | |
|---|---|
| *G11C 29/00* | (2006.01) |
| *G11C 16/10* | (2006.01) |
| *G11C 11/406* | (2006.01) |
| *G11C 29/44* | (2006.01) |
| *G11C 16/28* | (2006.01) |
| *G11C 16/34* | (2006.01) |

(Continued)

(52) U.S. Cl.
CPC ............ *G11C 16/10* (2013.01); *G11C 11/406* (2013.01); *G11C 11/5628* (2013.01); *G11C 11/5642* (2013.01); *G11C 16/26* (2013.01); *G11C 16/28* (2013.01); *G11C 16/349* (2013.01); *G11C 16/3418* (2013.01); *G11C 16/3495* (2013.01); *G11C 29/4401* (2013.01); *G11C 29/52* (2013.01); *G11C 16/0483* (2013.01)

(58) Field of Classification Search
CPC .................. G11C 29/4401; G11C 29/4402
USPC .......... 365/185.09, 185.18, 200, 201, 210.12
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |

(Continued)

*Primary Examiner* — Hoai V Ho
*Assistant Examiner* — Jay Radke
(74) *Attorney, Agent, or Firm* — McDermott Will & Emery LLP

(57) ABSTRACT

Systems and methods for managing data retention in a solid-state storage system utilizing data retention flag bytes are disclosed. A data storage device includes a non-volatile memory comprising a plurality of non-volatile memory devices and a controller configured to write data to a memory unit of the non-volatile memory array and write a data retention flag value indicating a number of bits of the written data programmed in a first of a plurality of logical states. The controller is further configured to read the data and determine a number of bits having the first of the plurality of logical states in the read data, and determine a difference between the number of bits of the written data programmed in the first logical state and the number of bits having the first logical state in the read data. The difference is used to determine data retention characteristics of the non-volatile memory.

20 Claims, 9 Drawing Sheets

Related U.S. Application Data

(60) Provisional application No. 61/873,503, filed on Sep. 4, 2013.

(51) Int. Cl.
  *G11C 11/56* (2006.01)
  *G11C 16/26* (2006.01)
  *G11C 29/52* (2006.01)
  *G11C 16/04* (2006.01)

(56) References Cited

U.S. PATENT DOCUMENTS

| | | |
|---|---|---|
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Watson et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,330 B1 | 4/2014 | Sommer et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 9,263,136 B1 * | 2/2016 | Zhao .................... G11C 16/10 |
| 2005/0281112 A1 | 12/2005 | Ito et al. |
| 2008/0209150 A1 | 8/2008 | Byeon |
| 2010/0174849 A1 | 7/2010 | Walston et al. |
| 2010/0250793 A1 | 9/2010 | Syu |
| 2011/0044101 A1 | 2/2011 | Chou et al. |
| 2011/0099323 A1 | 4/2011 | Syu |
| 2011/0283049 A1 | 11/2011 | Kang et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0016562 A1 | 1/2013 | Mun |
| 2013/0132638 A1 | 5/2013 | Horn et al. |
| 2013/0145106 A1 | 6/2013 | Kan |
| 2013/0185606 A1 | 7/2013 | Fai |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

DATA RETENTION FLAGS IN SOLID-STATE DRIVES

CROSS-REFERENCE TO RELATED APPLICATION

The present application claims the benefit of priority under 35 U.S.C. §120 as a continuation of U.S. patent application Ser. No. 14/090,426 entitled "Data Retention Flags in Solid-State Drives," filed on Nov. 26, 2013, which claims the benefit of priority under 35 U.S.C. §119, as a nonprovisional of U.S. Provisional Application No. 61/873,503 entitled "Data Retention Flags in Solid-State Drives," filed on Sep. 4, 2013, the disclosures of which are hereby incorporated by reference in their entirety for all purposes.

BACKGROUND

Field

This disclosure relates to data storage systems. More particularly, the disclosure relates to systems and methods for monitoring data retention in solid-state drives.

Description of Related Art

Certain solid-state memory devices, such as flash drives, store information in an array of memory cells constructed with floating gate transistors. In single-level cell (SLC) flash devices, each cell stores a single bit of information. In multi-level cell (MLC) devices, each cell stores two or more bits of information. When a read operation is performed, the electrical charge levels of the cells are compared to one or more voltage reference values (also called "voltage read level" or "voltage threshold") to determine the state of individual cells. In SLC devices, a cell can be read using a single voltage reference value. In MLC devices, a cell is read using multiple voltage references values. Certain solid-state devices allow for a memory controller to set voltage read levels.

Various factors can contribute to data read errors in solid-state memory devices. These factors include charge loss or leakage over time, and device wear caused by usage. When the number of bit errors on a read operation exceeds the ECC (error correction code) correction capability of the storage subsystem, the read operation fails. Voltage read levels can contribute to a device's ability to decode data.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

Figure 1:
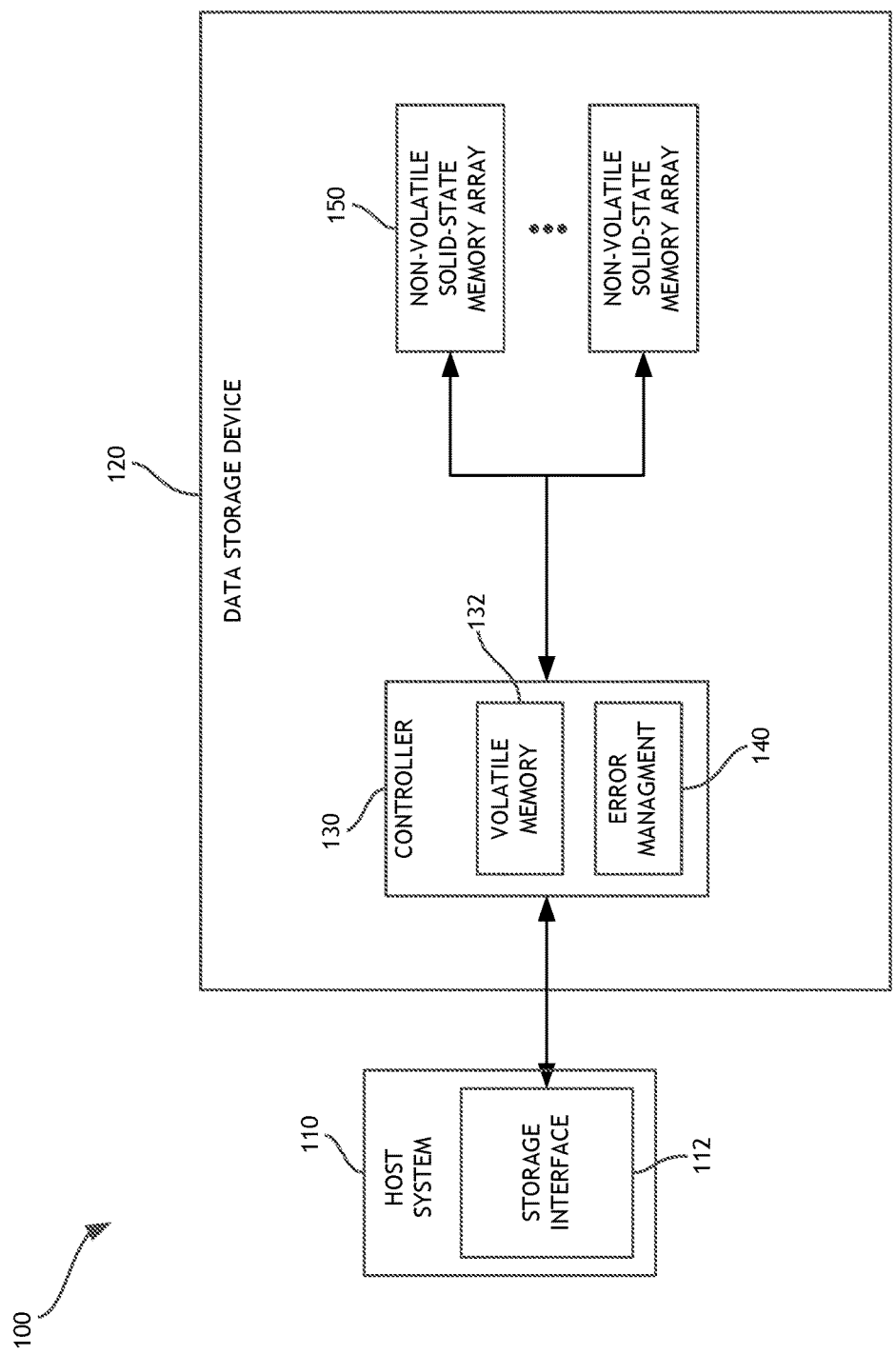
FIG. 1 is a block diagram illustrating a combination of a host system with storage device including an error management module.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

In certain solid-state media, such as NAND Flash, "data retention" refers to a memory failure factor relating to how long memory cells maintain a correct programmed state when the memory array is not under power bias. Data retention can be dependent on external environmental factors, such as, for example, high temperature and number of program/erase (P/E) cycles, which tend to degrade data retention in certain embodiments. Therefore, precise information relating to the data retention of solid-state memory can be useful in managing drive performance. However, obtaining such information can present significant challenges in solid-state memory systems.

In certain embodiments, a real timestamp is utilized to monitor data age in a solid-state data storage device, wherein the timestamp is stored in solid-state memory and provides a record of the time when data is programmed to the solid-state memory. The timestamp may accurately account for the time that elapses after programming for data retention purposes. However, using a time stamp alone, the system temperature, which can be particularly significant with respect to heavily-cycled blocks and can vary over time, may not be systematically accounted for. According to Arrhenius' equation, data retention may accelerate exponentially with elevated temperature, and therefore temperature effect can be significant. It may therefore be desirable to account for temperature effect in data retention management systems.

Certain embodiments disclosed herein provide systems and methods wherein additional metadata is programmed together with the raw data on the target page. The metadata may contain information relating to the raw data of the page, such as '1' or '0' bit count information. Upon execution of a read request, the data storage device may compare the count of '0' or '1' bits obtained from the read of the raw data against the count metadata stored. The difference between the count(s) for the raw data and the count(s) stored in metadata can provide a measure of data retention effect, wherein such measure may substantially account for both time and temperature. In certain embodiments, an optimal, or adjusted, reading voltage can be determined based on such data retention information when using a calibrated memory. The differential bit count information may also be adopted as an indicator for when certain data refreshing operations, such as data scrubbing, garbage collection, and/or the like, should be performed. For example, such information may be determined from raw bit error rate (RBER), which may be indicated by the difference information. In certain embodiments, data retention management functionality described herein may be performed independently of participation of the system error correction functionality (e.g., ECC engine).

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "target page," or variations thereof are used herein according to their broad and ordinary meaning. For example, "page" may refer to a block of a physical memory cells, or to the physical memory cells themselves. Furthermore, within a multi-level cell (MLC), "page" may refer to either of upper or lower pages.

The terms "equivalent," as used to describe equivalent data retention time, may refer to an effective data retention state of a cell, block, die, or other portion of solid-state memory. Therefore, equivalent data retention time may take into consideration both the temperature experienced by the memory, as well as the time the data has been written to memory.

Data Storage System

FIG. 1 is a block diagram illustrating an embodiment of a combination of a host system 110 with a data storage device 120 incorporating error management functionality in accordance with embodiments disclosed herein. As shown, the data storage device 120 (e.g., hybrid hard drive, solid-state drive, any storage device utilizing solid-state memory, etc.) includes a controller 130, which in turn includes an error management module 140. In certain embodiments, the error management module 140 is configured to utilize one or more data retention flag bytes stored in blocks, or pages, of the non-volatile solid-state memory 150 to estimate effective data retention time and/or to calculate voltage read levels. The controller 130 can further include internal memory 132 for caching system mapping data, which may be of one or more suitable memory types, such as, for example, DRAM. In some embodiments, the controller 130 is configured to perform the data retention management functions as further described below.

The controller 130 may be configured to receive memory access commands from a storage interface (e.g., a device driver) 112 residing on a host system 110. The controller 130 may further execute commands in response to such host-issued memory commands in the non-volatile solid-state memory arrays 150. Storage access commands communicated by the storage interface 112 can include write and read commands issued by the host system 110. The commands can specify a block address in the data storage device 120, and the controller 130 can execute the received commands in the non-volatile solid-state memory array(s) 150. Data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the data storage device. For example, mapping table data may be stored in non-volatile memory array(s) 150 in order to allow for recreation of mapping tables following a power cycle.

In certain embodiments, on power-up, the controller may cache mapping table data stored in the non-volatile solid-state memory array(s) 150 to volatile memory 132. In response to receipt and execution of host-issued memory commands, the controller 130 may update the cached mapping table data and periodically or sporadically flush such data to the memory array(s) 150. For example, as data stored in volatile memory can be lost when power to the memory is removed, it may be necessary or desirable to flush any cached mapping data to non-volatile memory before power to the controller 130 is lost.

In an embodiment, the data storage device 120 may be a hybrid disk drive that additionally includes magnetic memory storage (not shown). In such case, one or more controllers 130 may control the magnetic memory storage and the non-volatile solid-state memory array(s) 150.

Figure 2A:
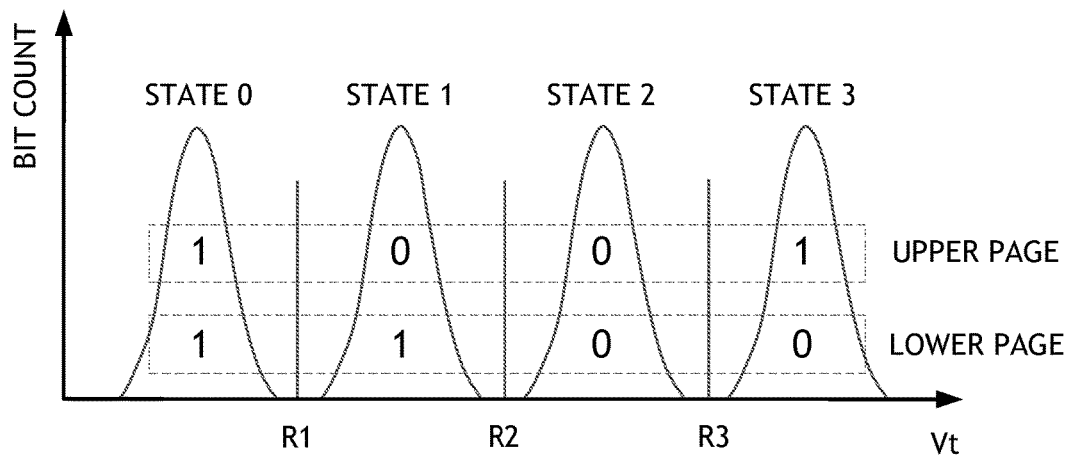
FIG. 2A is a graph showing a probability distribution of cells in a non-volatile memory array according to an embodiment.

FIG. 2A is a graph showing a probability distribution of cells in a non-volatile memory array according to an embodiment. The distribution of FIG. 2A is associated with an MLC programming scheme, in which two bits of information are stored in a single memory cell. However, it should be understood that systems and methods disclosed herein may be utilized with respect to single-level cell (SLC) technology, or other technologies.

FIG. 2A shows four programming states (States 0-3), wherein each state represents two bits of data. In certain embodiments, the programming states each comprise a most-significant bit, referred to herein as the "upper page," and a least-significant bit, referred to herein as the "lower page." Furthermore, in certain embodiments, "upper page" may refer to the least-significant bit, while "lower page" refers to the most-significant bit.

Figure 2B:
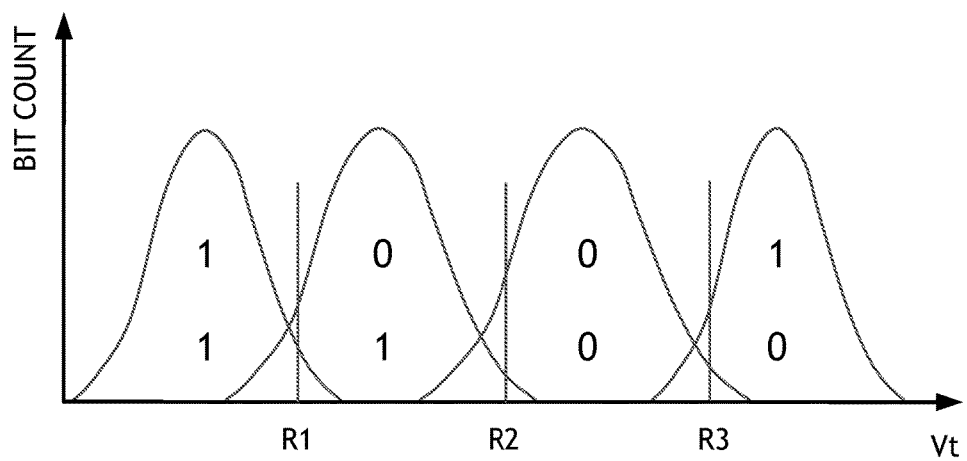
FIG. 2B is a graph showing a probability distribution of cells including overlapping states according to an embodiment.

Over time, memory degradation, loss of data retention, and the like, can cause the states of a voltage distribution can widen and overlap. FIG. 2B shows the voltage distribution of FIG. 2A, wherein the programming states have overlapped, which can have a negative effect on data retention. For example, as one state overlaps another, the charge of a memory cell may cross the relevant read threshold, causing a bit to "flip" from '0' to '1,' or vice versa.

Data Retention Flag Bytes

Certain embodiments disclosed herein provide for the assignment of one or more bytes in a target page as one or more copies of a data retention flag. The flag may include a count of the number of '0' or '1' bits in the raw data to be written to the target page. In certain embodiments, the data retention flag is stored in a separate memory array or device than the raw data. As described herein, a variable 'Np' may be used to represent the count of the number of '0' or '2' bits, which may be stored in usable area of the target page, which is described below with respect to FIG. 3.

Figure 3:
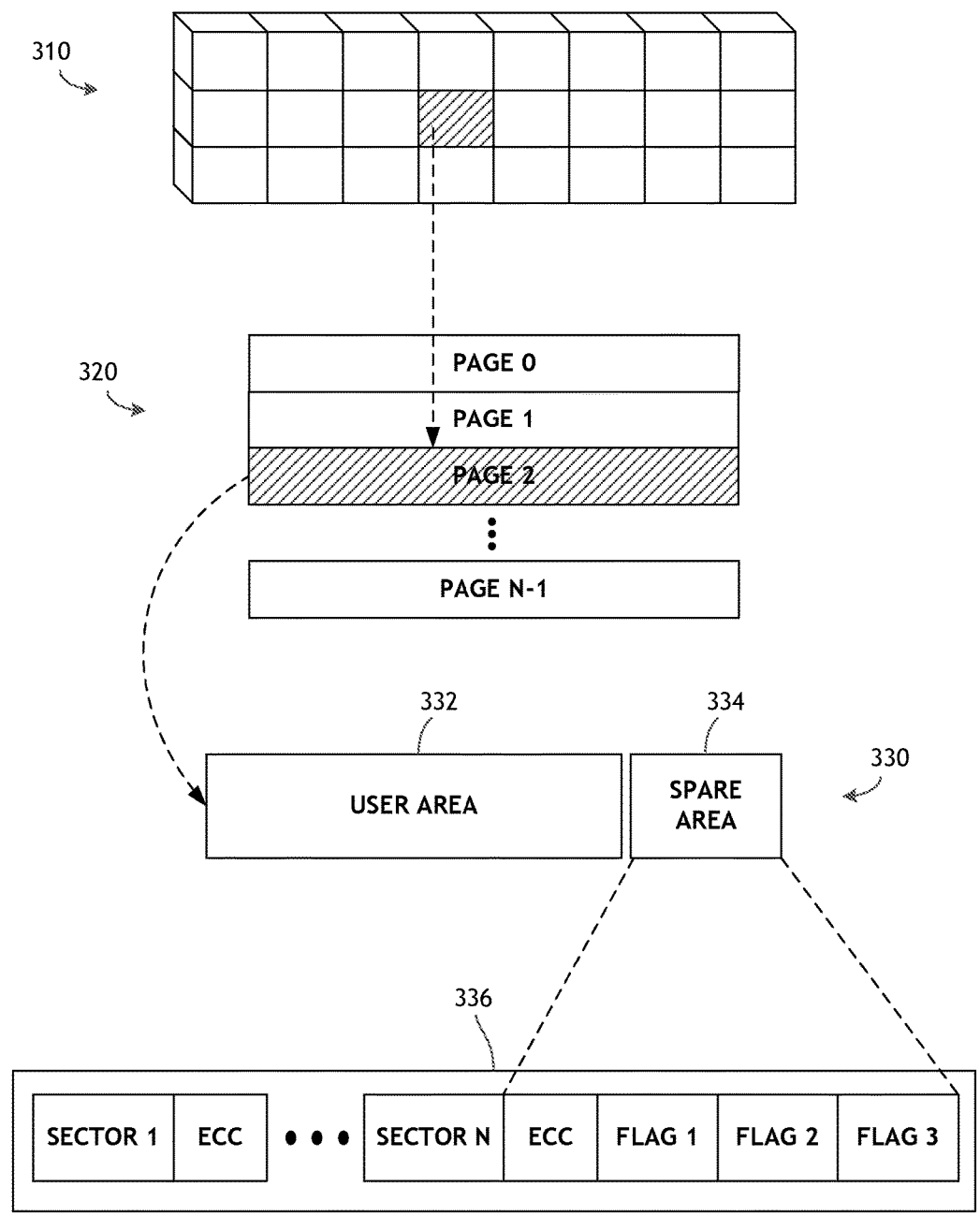
FIG. 3 illustrates an example block and page scheme in a solid-state array according to one or more embodiments.

FIG. 3 illustrates an example block and page scheme in a solid-state array according to one or more embodiments. In certain embodiments, page units 320 are used to store data, where a group of pages is referred to as a block. A solid-state array may comprise a plurality of blocks 310, each block comprising a plurality of pages 320. In certain embodiments, the page size may be fixed from, for example, 512 B to 8 KB, while the block size may be, for example, between 4 KB and 128 KB. The page unit may be partitioned into two or more areas. Specifically, a page 330 may include an area designated for raw data ("user area"), as well as a separate area reserved for FCC and/or other software information ("spare area"). In certain embodiments, the spare area includes approximately 64 bytes. For example, the spare area may be used to store, among possibly other things, metadata associated with the raw data (such as bad block identification, page and block data structures, error correction code (ECC), data retention flags, etc.). The data structure 336 illustrated in FIG. 3 comprises a page of solid-state memory where both FCC and data retention flag bytes (e.g., for storing Np value(s)) are present.

In certain embodiments, the '0' or '1' count (Np) is stored in the spare area 334 of the page 330. Alternatively, Np may be stored in bytes allocated from the user area of the page. In certain embodiments, Np is stored in a separate page, array, or device than the raw data with which it is associated. The data structure 336 includes interleaved user area and spare area. As shown, the spare area 334 may include one or more ECC sectors, as well as one or more additional flag bytes, or sectors. Np may be stored in one or more of the flag bytes. When the raw data is read, the number of '1' or '0' bits may be extracted from the read operation (represented herein by the variable Nr).

Figure 4B:
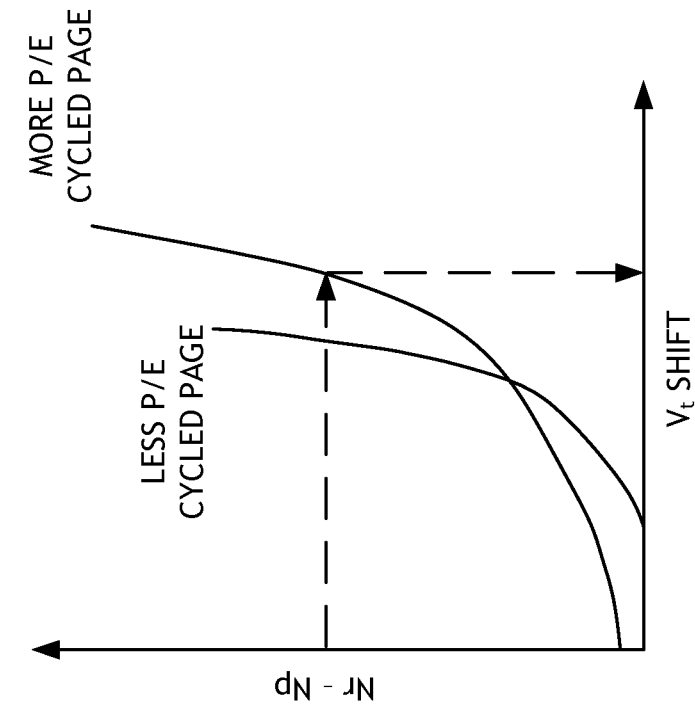
FIGS. 4A and 4B are graphs representing example data retention characteristics in a non-volatile memory array according to some embodiments.
Figure 4A:
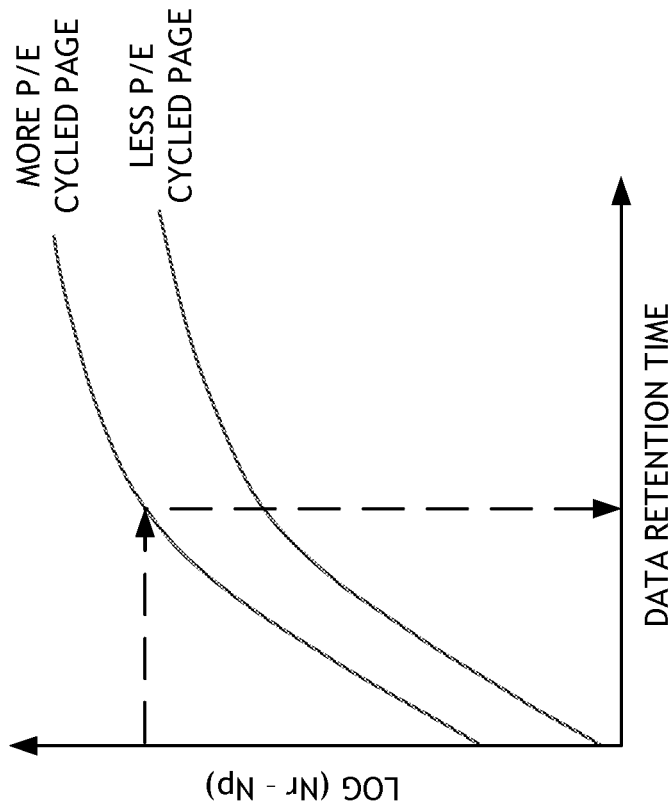

In certain embodiments, Nr may be compared to Np, wherein the difference between Np and Nr is used to estimate the data retention effect between the current read operation and the previous program operation associated with the data. The data retention effect indicated by the difference between Np and Nr may represent a combined effect of both time and temperature. FIG. 4A shows how effective data retention time ("equivalent time") may be related to the difference between Nr and Np, wherein the y-axis of the graph represents the log of the difference and the x-axis represents effective data retention time. The relationship demonstrated in FIG. 4A may be used to estimate effective data retention time based on Nr and Np. Since data retention can be closely related to the block's cycling condition, the P/E cycling information may be required, or desirable, to determine an accurate estimation of data retention.

Based on the difference between Np and Nr, the data storage device may also be configured to estimate how much the relevant voltage reading level ($V_t$) for the page, or one or more cells thereof, should be adjusted to reduce bit errors. FIG. 4B shows a graph that illustrates the relationship between $V_t$ shift and the difference between Nr and Np in an embodiment. Such relationship may be used to determine Vt shift information from the value of (Nr−Np). In certain embodiments, the desirable read level adjustment for a particular page is directly related to $V_t$ shift that the page exhibits.

In certain embodiments, prior to implementation of methods described herein, it may be desirable for a solid-state drive, or portions thereof, to be calibrated to determine the correlation among data retention, Nr−Np, and/or $V_t$ shift. Such calibration may be performed in any suitable manner, as understood by those having ordinary skill in the art. The characterization and calibration may involve taking data retention measurements of the drive with varying P/E cycling, retention time, temperature, and/or data retention-relevant characteristics. For example, the drive may be baked to accelerate data retention, wherein bit error counts are periodically taken to determine drive data retention behavior.

Systems and methods for determining data retention and/or read level adjustment in solid-state drives, as disclosed herein, may or may not involve ECC. In order to improve the integrity for the data retention flag, more than one set of Np may be programmed. Upon read, the data storage device may access a plurality of stored instances for determining the valid value of Np. In order to improve the reliability of the Np metadata, in certain embodiments, such metadata cells are programmed to lower Vt state(s), such as State 1 (first program state) or State 2 (second program state) as shown in FIG. 2A, or commonly referred to as programming in "lower page only mode."

If the flash page has approximately 8K bytes, a Np number stored in the spare area of the page may utilize approximately 2 bytes, for example. Therefore, in certain embodiments, three sets of Np may utilize approximately 6 bytes of storage space. In a data storage device including a randomizer, the number of '0's and '1's may be substantially close to each other. If, for example, there exists a 5% unbalance between the number of '0's and '1's, then the unbalance between the count of '0' and '1' may be in the vicinity of 1638 for an 8 KB page. Therefore, if the 4 KB point of the page is used as the middle point reference, the value for Np may be limited by a maximum of around 820, which can be programmed using 10 bits. Further, storing three copies of Np may therefore require approximately 30 bits; 4 bytes may provide enough storage space for such bits.

In certain embodiments, reliability of data retention flag bytes can be improved by programming such bytes interleaved with dummy bits between, for example, any two data retention flag bits; the dummy bites may not be programmed. Use of dummy bits may reduce cell-to-cell interference, thereby improving the read margins for the flag bytes.

With reference to FIGS. 2A and 2B, as described above, logic data coding may include 2-bits-per-cell in MLC memory, wherein the 2 bits are conceptually separated into upper and lower pages. The diagrams also illustrate the correlation between the upper page and lower page to Vt state, according to an embodiment. In certain embodiments, determining the lower page value involves performing a read operation at R2. Determining the upper page, on the other hand, may involve reads at R1 and R3.

In certain embodiments, determining upper page data may be relatively complex. As shown in FIG. 2A, both State 0 and State 3 include a '1' for the upper page value, and both State 1 and State 2 include a '0' for the upper page value. An increase of '1' can occur not only from a transition between States 3 and 2, but also from transition between States 0 and 1. Furthermore, a transition from State 0 to State 1 can be caused by read disturb and program disturb as well.

Figure 5:
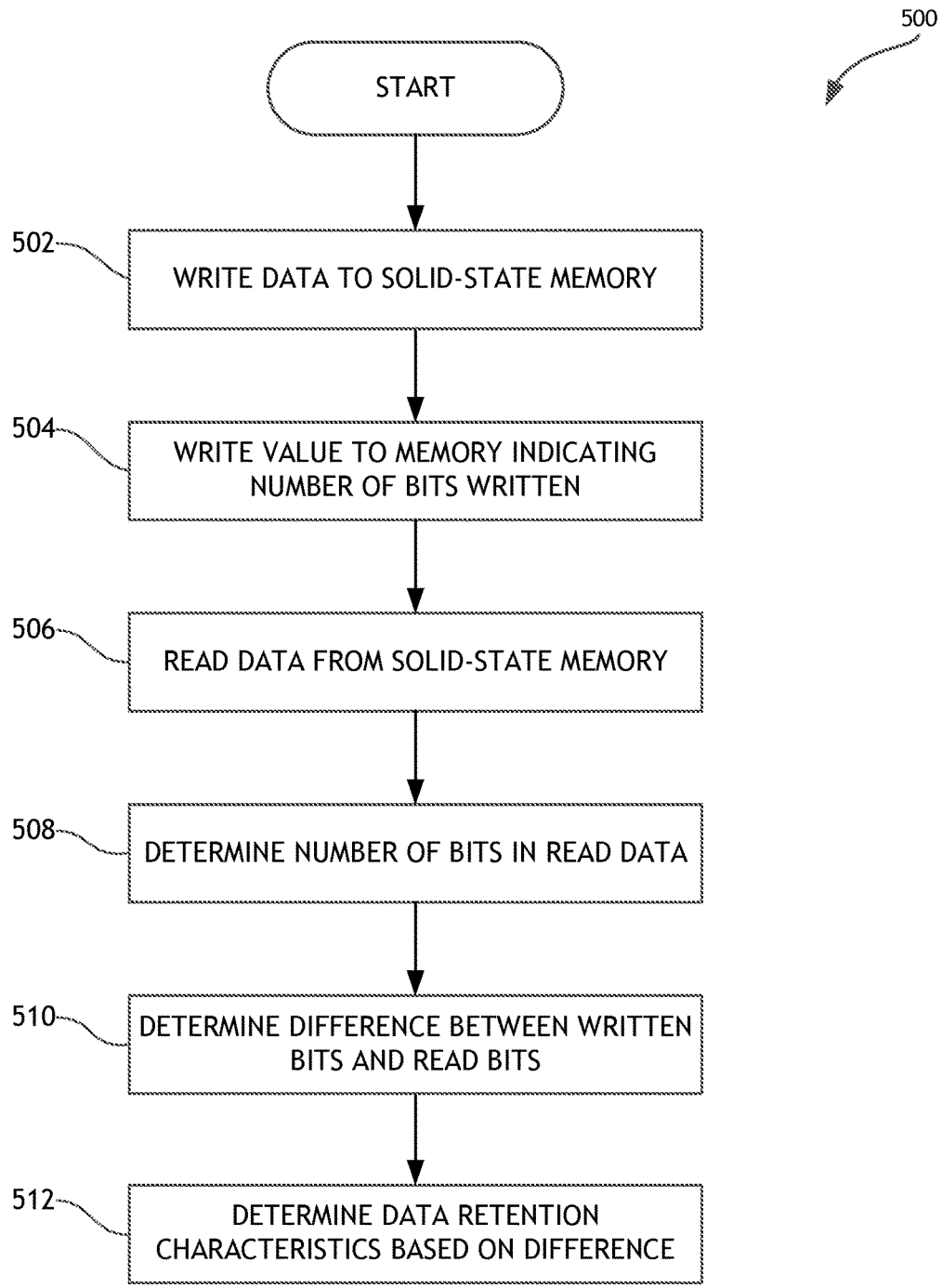
FIG. 5 is a flow diagram illustrating a process for managing data retention according to an embodiment.

FIG. 5 is a flow diagram is illustrating an example process 500 for a lower page read with data retention bytes implemented, as described herein. Some or all of the actions shown in the flow diagram of FIG. 5 may be performed by the controller 130 shown in FIG. 1. The process 500 includes writing data, such as user data from a host system, to solid-state memory at block 502. In addition to the data, one or more copies of a value are written to memory indicating the number of data bits written to a certain logical state, such as, for example, '0' or '1.' The value may be written to the solid-state memory in which the user data is stored, or may be written to a separate memory. In certain embodiments, the writing the data and the value, as shown at blocks 502 and 504, may be performed as part of a singular step.

When the user data is subsequently read from the solid-state memory at block 506, the number of bits of the read user data that are of the certain logical state is determined at block 508. The difference between the number of bits written to the certain logical state and the number of bits read of the certain logical state is determined at block 510. The difference is used to determine data retention characteristics of the solid-state memory.

Figure 6:
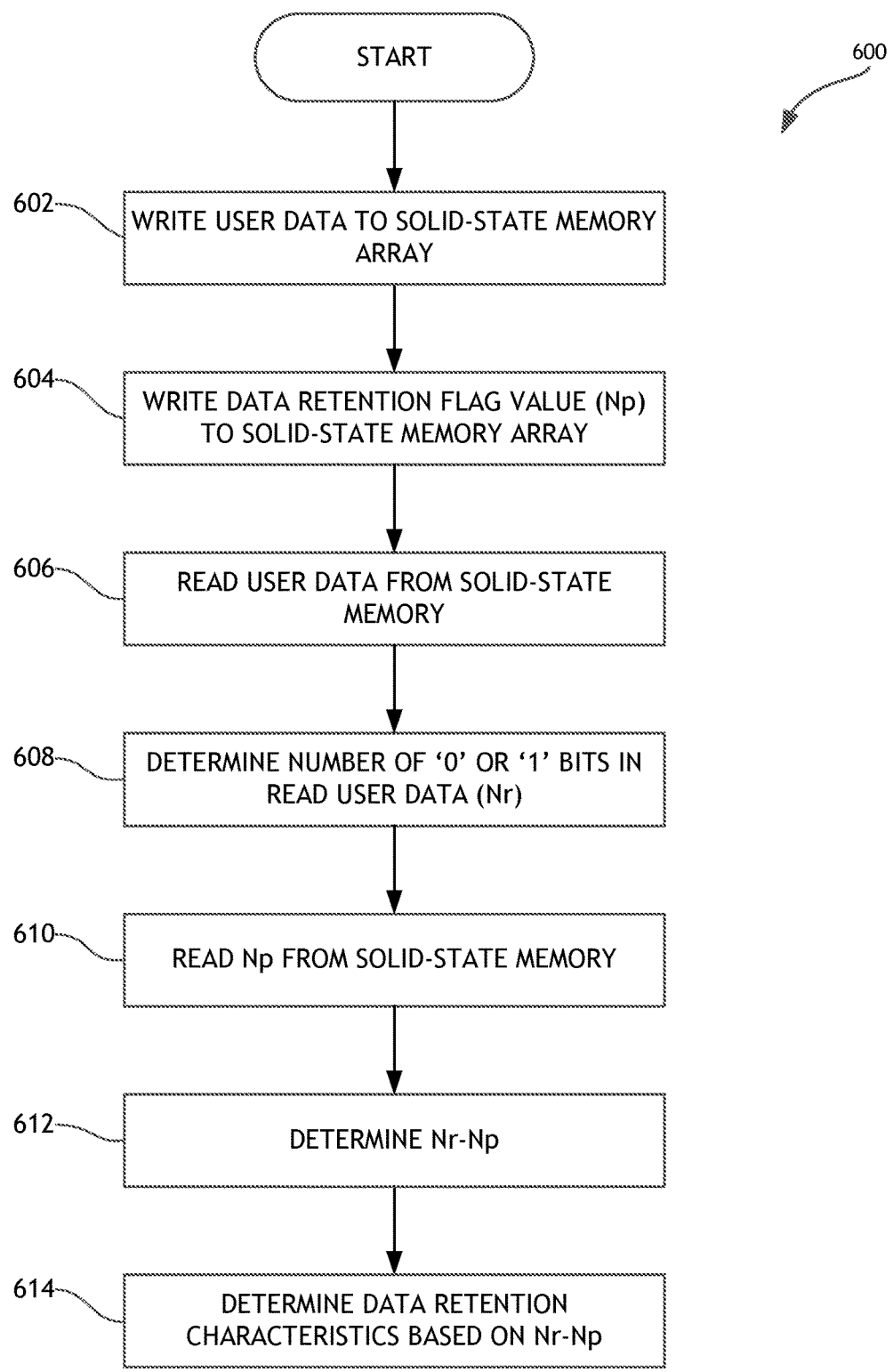
FIG. 6 is a flow diagram illustrating a process for managing data retention according to an embodiment.

FIG. 6 is a flow diagram illustrating another process 600 for managing data retention according to an embodiment. Some or all of the actions shown in the flow diagram of FIG. 6 may be performed by the controller 130 shown in FIG. 1. The process 600 includes writing data user data to a solid-state memory array at block 602. In addition to the user data, one or more copies of a data retention flag value (Np) are written to the solid-state memory array that indicate the number of data '0' or '1' bits of the user data that were written.

When the user data is subsequently read from the solid-state memory at block 606, the number of '0' or '1' bits (Nr) in the read user data is determined at block 608. Furthermore, the number Np stored in the memory is also read at block 610. The difference between Nr and Np (Nr−Np) is determined at block 612. The difference is used to determine data retention characteristics of the solid-state memory.

Figure 7:
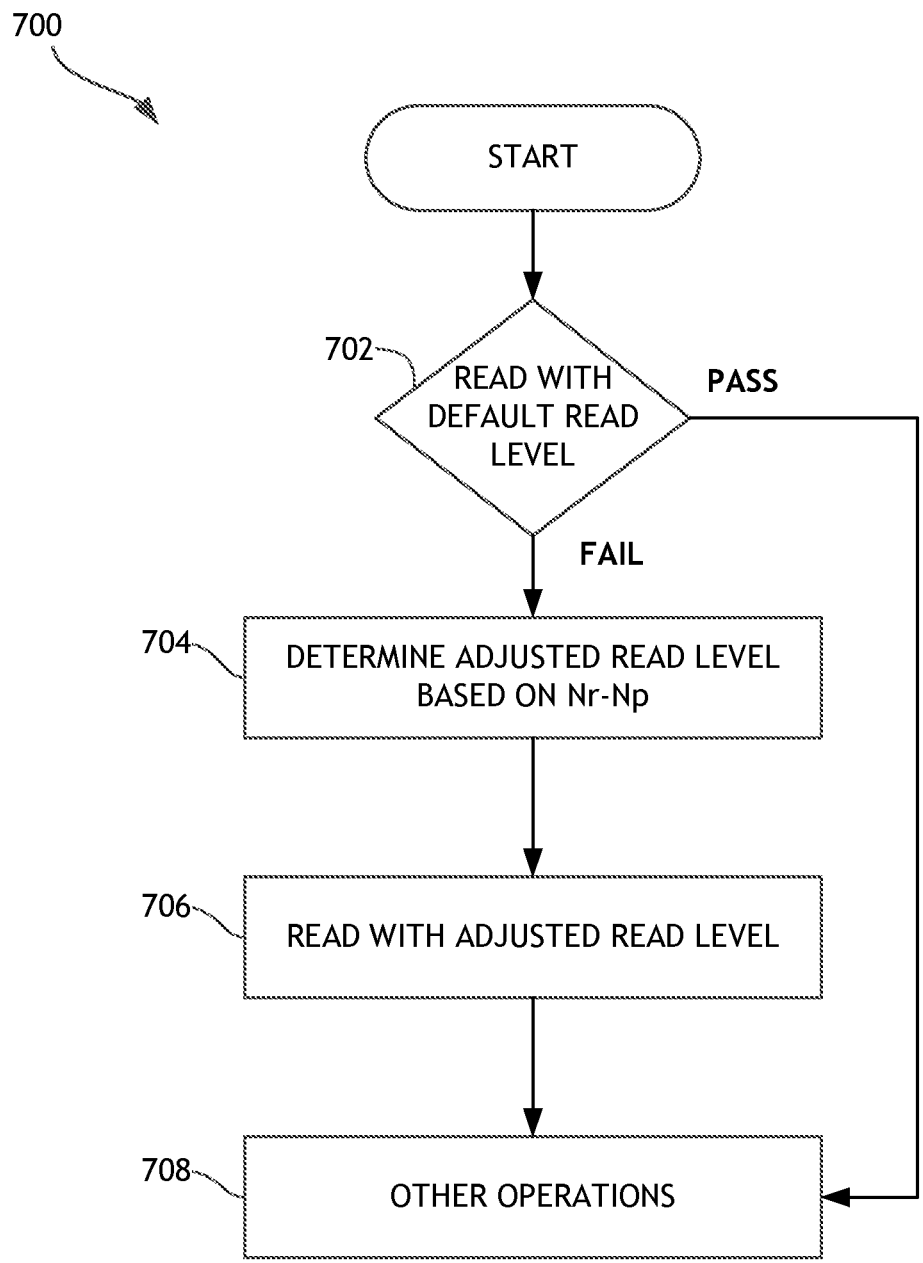
FIG. 7 is a flow diagram illustrating a process for determining voltage read level adjustment according to an embodiment.

FIG. 7 is a flow diagram illustrating a process 700 for determining voltage read level adjustment according to an embodiment. Some or all of the actions shown in the flow diagram of FIG. 7 may be performed by the controller 130 shown in FIG. 1. The process 700 includes reading solid-state memory at a default read level, shown at decision block 702, if the read is successful, the process 700 progresses to block 708 where the data storage device may engage in other operations. However, if the read operation fails, the process 700 proceeds to block 704, where the difference between Nr and Np, as described in detail above, is used to determine an adjusted read level. At block 706, the memory is read using the adjusted read level.

Figure 8:
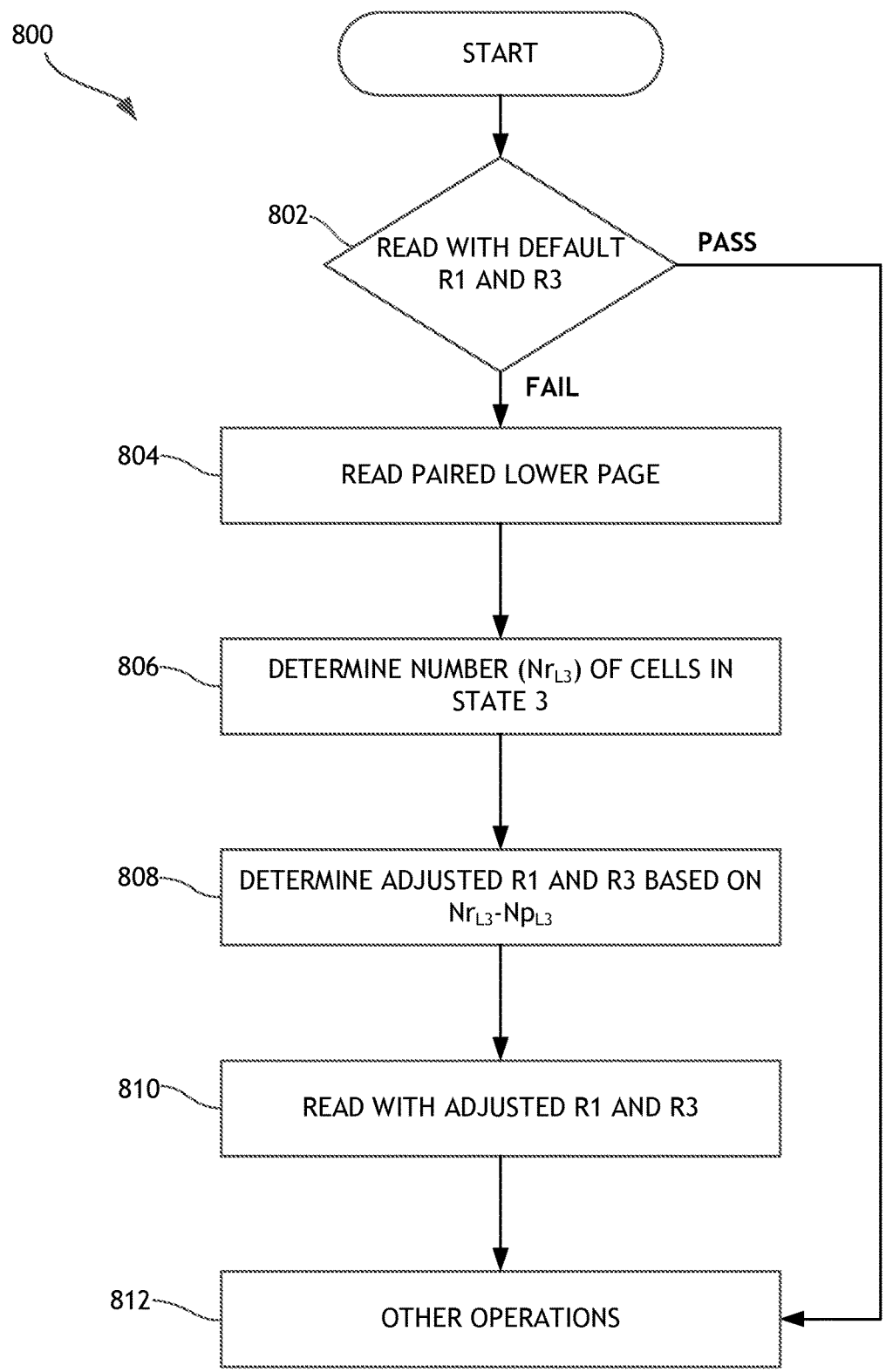
FIG. 8 is a flow diagram illustrating a process for performing upper page reads according to an embodiment.

FIG. 8 is a flow diagram illustrating a process 800 for performing upper page reads with data retention flag bytes according to an embodiment. Some or all of the actions shown in the flow diagram of FIG. 8 may be performed by the controller 130 shown in FIG. 1. The process 800 may involve reading upper page data using default voltage read levels. For example, reading upper page data may involve doing two reads, one at R1, and one at R3, as illustrated above in FIG. 2A. If the read is successful, the process 800 may proceed to block 812 where the data storage device may engage in other operations. However, if the read operation fails, the process 800 proceeds to block 804, where the respective paired lower page is read, which may provide information useful for determining the number of cells programmed to a highest voltage state, State 3 (see, e.g., FIG. 2A). The number of cells programmed to the solid-state memory in State 3 is referred to herein as $Np_{L3}$, which value may be stored as a flag value in the solid-state memory. Furthermore, the number of cells of user data read from solid-state memory that are associated with State 3 is referred to herein as $Nr_{L3}$.

At block 808, the difference between $Np_{L3}$ and $Nr_{L3}$ is determined, which may be used to determine adjusted voltage read levels for R1 and R3. In certain embodiments, the difference may be used for other purposes, such as to determine a data refreshing schedule, or for other data retention-related purposes. The data may then be read using the adjusted voltage read level values.

Figure 9:
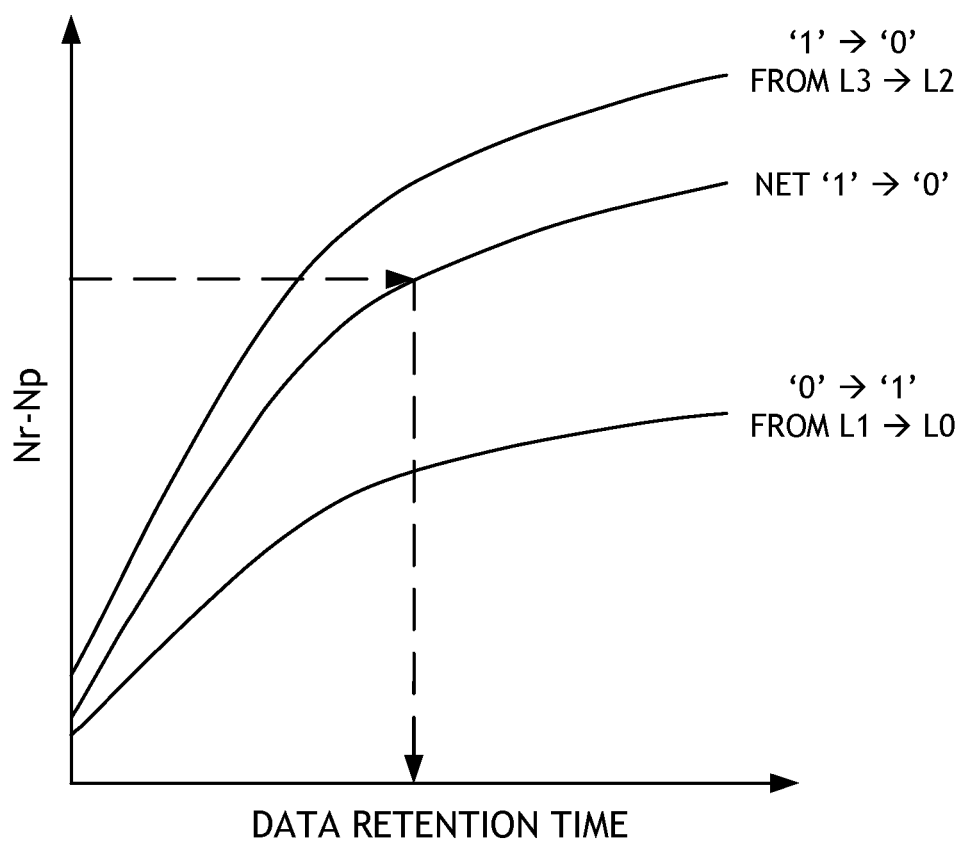
FIG. 9 is a graph showing data retention characteristics in a non-volatile memory array according to an embodiment.

FIG. 9 is a graph showing data retention characteristics in a non-volatile memory array according to an embodiment. The graph demonstrates how effective data retention time may be correlated with the difference between Np and Nr counts for R1, R3, and combined R1 and R3 reads. As shown, the number of transitions from '1' to '0' from bit flips between States 3 and 2 is generally greater than the number of transitions from '0' to '1' from bit flips between States 1 and 0. Generally, data retention can be more severer for higher Vt states (such as State 3) than for lower Vt states (such as State 1). So after data retention, the net effect in upper page bit fail may correspond to the increase of '1' to '0' transitions. As shown in FIG. 9, the number of '1's that transition to '0' may be greater than the number of '0's that transition to '1's, resulting in a net increase in the number of '0's. Therefore, the relationship between the net transition from '1' to '0' and effective data retention time may be represented. In an embodiment, upper page read is performed by simply counting the net number change Nr−Np and calibrating it with the memory's data retention data. Such an embodiment may provide relatively less accurate results, while being relatively simpler than embodiments disclosed above.

Certain factors, such as imperfect programming and cell-to-cell interference, even without data retention, may cause the actual number of '0' (or '1') bits Nr0 may differ from Np immediately after programming. Such difference is reflected in the calibration curves (FIGS. 4A and 9) with an offset that may be a function of P/E cycling condition. Therefore, the increment from Np to Nr0 can be used as a quality monitor for that block.

CONCLUSION

Certain systems and methods disclosed herein provide for automatically accounting of the combined effects on data retention of both time and temperature. Data retention can affect the failing bit number (transition from higher $V_t$ to lower $V_t$) and may be reflected in the value of Nr−Np, as described above. In certain embodiments, ECC is not required for equivalent data retention time and/or optimal $V_t$ shift estimation. Therefore, certain embodiments may provide a mechanism for read-level tracking in very poor data retention cases where FCC may fail with the default read level. By reading the raw data and comparing it against the reference flag(s), data retention, and therefore read level adjustment amount, may be determined. Such systems and methods may be effective whether the solid-state drive has been powered off or not.

The implementation these metadata bytes, as described herein, may indicate a threshold for data scrubbing alert. Because data retention flag bytes can be written at the page level, certain embodiments may provide an adaptive method for individual pages. If read substantially immediately after programming, comparison of Np and Nr can provide useful information for the page/block. In certain embodiments, data retention flag bytes may use two or few bytes, which may be assigned from the raw data in each flash page. Therefore, data retention flag bytes may not result in a significant waste of storage capacity.

With respect to upper page reads, lower page data may be required to determine cells in State 3. Then based on fail bit increases for cells in State 3, data retention effect may be correctly calculated. The process may include reading the upper page and it's paired lower page to determine the fail bit number for State 3 (or State 1) only. This however, may require the target number of State 3 cells in programming ($Np_{L3}$), which can be stored in the spare area of the page. Once the difference between Nr and Np is determined for either State 0 or State 1, the process may be similar to that shown in FIG. 5 for lower page read with data retention flag bytes.

Other Variations

Those skilled in the art will appreciate that in some embodiments, other types of data storage systems and/or power management can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
  a non-volatile memory array comprising a plurality of non-volatile memory devices; and
  a memory controller configured to:
    write raw data to a memory unit of the non-volatile memory array;
    write, in connection with the writing of the raw data, metadata to a memory indicating a number of bits of the written raw data;
    read, after the write, the raw data and metadata from memory unit;
    determine a difference between the read raw data and the number of bits of the written raw data indicated by the read metadata; and
    determine a measure of data retention for the memory unit based on the determined difference.

2. The data storage device of claim 1, wherein the controller is further configured to write the metadata interleaved with dummy bits to reduce cell-to-cell interference.

3. The storage device of claim 1, wherein the memory controller is further configured to:
  schedule a data refreshing operation based on the determined measure of data retention.

4. The storage device of claim 3, wherein the memory controller is further configured to:
  determine a raw bit error rate associating with the reading, at least in part based on the determined measure of data retention, wherein the data refreshing operation is also scheduled based on the raw bit error rate.

5. The storage device of claim 1, wherein the memory controller is further configured to:
  adjust, based on the determined measure of data retention, a voltage level used to read bit values from memory cells in the non-volatile memory array.

6. The storage device of claim 1, wherein the metadata is stored in the memory unit with the written raw data.

7. The storage device of claim 6, wherein the memory unit is a page of memory, and wherein the number of bits of the written raw data indicated by the metadata is stored in a spare area of the page of memory.

8. The storage device of claim 1, wherein the memory unit is part of a first memory device of the non-volatile memory array, and wherein the metadata is stored in a second memory device of the non-volatile memory array.

9. The storage device of claim 1, wherein the number of bits of the written raw data indicated by the metadata is a number of binary zeros or a number of binary ones making up the raw data.

10. The storage device of claim 1, wherein memory controller being configured to write the metadata comprises the memory controller being configured to:
  interleave dummy bits within the written metadata.

11. The storage device of claim 1, wherein the memory controller being configured to read comprises the memory controller being configured to:
  initiate a read of an upper page of memory cells;
  determine a memory operation failure in connection with the reading of the upper page of memory cells; and
  read, responsive to the memory operation failure, a lower page of memory cells paired with the upper page of memory cells; and
  determine, based on reading the lower page, a first count of the upper memory cells corresponding to a highest voltage state of a plurality of memory states,
  wherein the memory controller being configured to determine the difference between the read raw data and the number of bits of the written raw data comprises the memory controller being configured to determine a difference between the first count and a second count, stored in the metadata, of upper memory cells programmed to the highest voltage state.

12. A method of managing data retention in a data storage system comprising a non-volatile memory array, the method comprising:
  writing raw data to a memory unit of a non-volatile memory array;
  writing, in connection with the writing of the raw data, metadata to a memory indicating a number of bits of the written raw data;
  reading the written raw data and the written metadata;
  determining a difference between the read raw data and the number of bits of the written raw data indicated by the read metadata; and
  determining a measure of data retention for a group of memory cells in the non-volatile memory array based on the determined difference.

13. The method of claim 12, further comprising:
scheduling a data refreshing operation based on the determined measure of data retention.

14. The method of claim 13, further comprising:
determining a raw bit error rate associating with the reading, at least in part based on the determined measure of data retention, wherein the scheduling is also based on the raw bit error rate.

15. The method of claim 12, further comprising:
adjusting, based on the determined measure of data retention, a voltage level used to read bit values from memory cells in the non-volatile memory array.

16. The method of claim 12, wherein the metadata is stored in the memory unit with the written raw data.

17. The method of claim 16, wherein memory unit is a page of memory, and wherein the number of bits of the written raw data indicated by the read metadata is stored in a spare area of the page of memory.

18. The method of claim 12, wherein the memory unit is part of a first memory device of the non-volatile memory array, and wherein the metadata is stored in a second memory device of the non-volatile memory array.

19. The method of claim 12, wherein the number of bits of the written raw data is a number of binary zeros or a number of binary ones making up the raw data.

20. The method of claim 12, wherein the reading comprises:
initiating a read of an upper page of memory cells;
determining a memory operation failure in connection with the reading of the upper page of memory cells; and
reading, responsive to the memory operation failure, a lower page of memory cells paired with the upper page of memory cells; and
determining, based on reading the lower page, a first count of the upper memory cells corresponding to a highest voltage state of a plurality of memory states,
wherein determining the difference between the read raw data and the number of bits of the written raw data indicated by the read metadata comprises determining a difference between the first count and a second count, stored in the metadata, of upper memory cells programmed to the highest voltage state.

* * * * *